(12) United States Patent
Gattuso et al.

(10) Patent No.: US 6,814,602 B1
(45) Date of Patent: Nov. 9, 2004

(54) TEST CONNECTOR WITH LEAF SPRINGS

(75) Inventors: Andrew Gattuso, Phoenix, AZ (US); Sung-Pei Hou, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/630,581

(22) Filed: Jul. 29, 2003

(51) Int. Cl.[7] .............................................. H01R 13/62
(52) U.S. Cl. ...................................................... 439/331
(58) Field of Search ................................ 439/331, 482, 439/73, 330

(56) References Cited

U.S. PATENT DOCUMENTS

| | | | |
|---|---|---|---|
| 5,320,550 A | | 6/1994 | Uratsuji et al. |
| 5,493,237 A | * | 2/1996 | Volz et al. ..................... 439/73 |
| 6,514,097 B1 | * | 2/2003 | Conroy ....................... 439/330 |
| 6,716,049 B1 | * | 4/2004 | Gattuso et al. ............. 439/331 |

* cited by examiner

Primary Examiner—Tho D. Ta
Assistant Examiner—Felix O. Figueroa
(74) Attorney, Agent, or Firm—Wei Te Chung

(57) ABSTRACT

A test connector (10) includes a connector body (30) with terminals therein, a lid (20), four guiding mechanisms (50), and two pressing mechanisms (40). The connector body comprises an outer housing (34) and an inner housing (32) for receiving an IC package (80). Each pressing mechanism comprises a first shaft (44) attached to the lid, a second shaft (46) mounted to the outer housing, two operating levers (42) engaged between the first and second shafts, and a leaf spring (48) mounted to the first shaft. When the lid is in an upper position, the pressing mechanisms are in a first position in which the leaf springs are disengaged from the IC package, while when the lid is in a lower position, the pressing mechanisms are moved to a second position in which the leaf springs are engaged with the IC package thereby the IC package can be tested.

12 Claims, 4 Drawing Sheets

TEST CONNECTOR WITH LEAF SPRINGS

BACKGROUND OF THE INVENTION

1. Field of the Invention

The present invention relates to an electrical connector such as one used for testing of integrated circuit (IC) packages, and particularly to a test connector with a connector body and a pair of pressing mechanisms.

2. Description of Prior Art

Test connectors are widely used for receiving and testing of IC packages such as land grid array (LGA) chips. A conventional test connector includes a main body with a plurality of contacts therein, a lid mounted on the main body, and a plurality of latch members attached to the main body. Contact elements of an LGA chip are located on free ends of contacts of the main body. The LGA chip is driven downwardly, so that the contact elements resiliently press on the contacts. In order to maintain the LGA chip in the position, the latch members are removably engaged with the LGA chip. The latch members thus ensure that the LGA chip maintains resilient pressure on the contacts.

FIGS. 5 and 6 show a test connector 90 in accordance with U.S. Pat. No. 5,320,550 issued to Yamaichi Electric Co., Ltd. and Tokyo on Jun. 14, 1994. The test connector 90 comprises finger-like latch members 94. The latch members 94 are pivotally mounted to each of opposite ends of a main body 92 of the test connector 90 by shafts 96, and extend upwardly from respective pivotal portions of the main body 92. Lock tabs 940 are formed on distal ends of the latch members 94. When, an LGA chip (not shown) is placed on the main body 92, the lock tabs 940 are engageable with opposite ends of the LGA chip. In other words, when the latch members 94 are pivoted about the shafts 96 to respective engaging positions, the lock tabs 940 are brought into engagement with the LGA chip. When the latch members 94 are pivoted away from the respective engaging positions, the lock tabs 940 are disengaged from the LGA chip.

When the latch members 94 are in the engaging position, a distance from bottom surfaces of the lock tabs 940 to an upper surface of the main body 92 is represented by "A." Distance "A" is essentially fixed. That is, when a thickness of the LGA chip is equal to distance "A," the LGA chip can be received in the test connector 90 and can be effectively pressed by the latch members 94. If the thickness of the LGA chip is greater than distance "A," the latch members 94 cannot reach the engaging position. If the thickness of the LGA chip is less than distance "A," the lock tabs 940 of the latch members 94 are not securely engaged with the LGA chip in the engaging position. In other words, the test connector 90 is only suited for testing a single kind of LGA chip having the thickness "A". This is unduly inconvenient and inefficient. Furthermore, the lock tabs 940 of the latch members 94 have little resilience or flexibility. Thus, during testing of the LGA chip, the lock tabs 940 are prone to damage the LGA chip.

A new test connector that overcomes the above-mentioned problems is desired.

SUMMARY OF THE INVENTION

An object of the present invention is to provide a test connector having a pressing mechanism which enables testing of different IC packages having different thicknesses.

In order to achieve the above object, a test connector in accordance with a preferred embodiment of the present invention comprises a connector body with a plurality of terminals therein, a lid mounted on the connector body, four guiding mechanisms disposed between the connector and the lid, and a pair of pressing mechanisms for holding or releasing an IC package. The connector body comprises an inner housing and an outer housing, the inner housing mounted on the outer housing and receiving the IC package. Each pressing mechanism comprises a first shaft attached to the lid, a second shaft mounted to the outer housing, a pair of operating levers engaged between the first shaft and the second shaft, and a leaf spring mounted to the first shaft and disposed between the operating levers. When the lid is in an upper position, the pressing mechanisms are in a first position in which the leaf springs are disengaged from the IC package, while the lid is in a lower position, the pressing mechanisms are moved to a second position in which the leaf springs are engaged with the IC package thereby the IC package mechanically and electrically being connected to the terminals.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
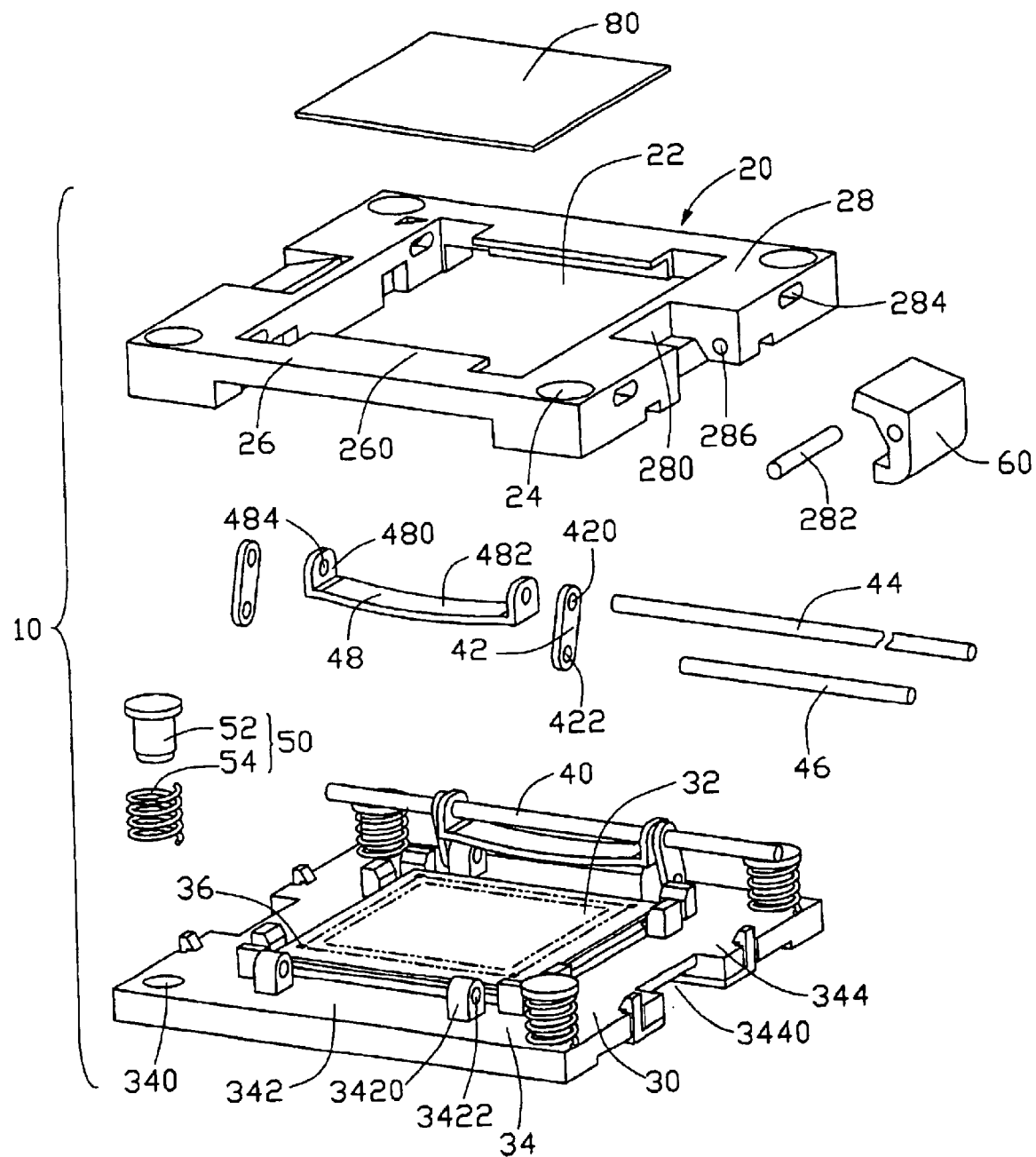
FIG. 1 is a simplified, exploded, isometric view of a test connector in accordance with the preferred embodiment of the present invention, together with an LGA chip.

FIG. 1 shows a test connector 10 in accordance with the preferred embodiment of the present invention, together with an integrated circuit (IC) package such as a land grid array (LGA) chip 80. The test connector 10 is adapted for receiving the LGA chip 80 in order to test the LGA chip 80. The test connector 10 comprises a connector body 30 fixed on a circuit substrate such as a printed circuit board (PCB) (not shown), a lid 20 engaged with the connector body 30, four guiding mechanisms 50 received between the connector body 30 and the lid 20, and a pair of pressing mechanisms 40 engaged between the lid 20 and the connector body 30 for holding or releasing the LGA chip 80.

The LGA chip 80 has a plurality of contact elements (not shown) on a lower surface thereof. When the LGA chip 80 is held by the pressing mechanisms 40, each contact element is pressed against an upper end of a corresponding conductive terminal (not shown) of the test connector 10.

The connector body 30 comprises an outer housing 34, and an inner housing 32 fitted in the outer housing 34. The connector body 30 defines a plurality of passageways 36 arranged in a matrix, for receiving a plurality of the terminals (not shown). Each passageway 36 spans from a top face of the inner housing 32 to a bottom face of the outer housing 34. Four blind holes 340 are defined in fours corners of the outer housing 34, respectively. The outer housing 34 comprises a pair of opposite first end portions 342, and a pair of opposite first side portions 344 perpendicular to the first end portions 342. Each first end portion 342 has a pair of spaced, aligned projections 3420. Each projection 3420 defines a receiving hole 3422 in an upper end thereof. Each first side portion 344 defines a first cutout 3440 in a center of an outer side thereof.

The lid 20 is substantially a rectangular frame, and is movable in vertical directions relative to the outer housing 34 of the connector body 30. The lid 20 defines a central opening 22. This provides the test connector 10 with an open top, allowing the LGA chip 80 to be inserted onto the inner housing 32 of the connector body 30 and removed after testing. Four through guiding holes 24 are defined in four corners of the lid 20 respectively, corresponding to the blind holes 340 of the connector body 30. The guiding holes 24 and the blind holes 340 are adapted for receiving the guiding mechanisms 50. The lid 20 comprises a pair of opposite second end portions 26 corresponding to the first end portions 342 of the connector body 30, and a pair of opposite second side portions 28 corresponding to the first side portions 344 of the connector body 30. An extending portion 260 extends perpendicularly inwardly from an upper part of an inner side of each second end portion 26. Each second side portion 28 defines a pair of aligned receiving grooves 284 in opposite ends thereof respectively, the receiving grooves 284 being at substantially a same height as the extending portions 260. Each second side portion 28 also defines a second cutout 280 in a center of an outer side thereof, corresponding to a respective first cutout 3440 of the outer housing 34. Each second cutout 280 thereby defines a pair of opposing end walls (not labeled). Each end wall defines a mounting hole 286 therein. A pair of pivot axles 282 is mounted in the mounting holes 286 of the second cutouts 280 respectively, for pivotally mounting a pair of latches 60 in the second cutouts 280 respectively. The latches 60 can rotate about the pivot axles 282. When the test connector 10 is in a closed position, the latches 60 fasten the lid 20 on the connector body 30.

Each guiding mechanism 50 comprises a guiding post 52 and a coil spring 54. The coil spring 54 is disposed around the guiding post 52, in order to provide biasing force between the outer housing 34 of the connector body 30 and the lid 20. The guiding posts 52 are retained in the blind holes 340 of the connector body 34. In addition, the guiding posts 52 are received in the guiding holes 24 of the lid 20, thereby preventing lateral movement of the lid 20 relative to the outer housing 34. Thus, the guiding mechanisms 50 are received in and span between the blind holes 340 of the connector body 34 and the guiding holes 24 of the lid 20. With this structure, when externally applied pushing force on the lid 20 is released, the coil springs 54 decompress, and the lid 20 rises to an upper position as shown in FIG. 3.

Each pressing mechanism 40 comprises a long first shaft 44, a short second shaft 46, a pair of operating levers 42 engaged between the first shaft 44 and the second shaft 46, and a leaf spring 48 engaged with the first shaft 44. Each operating lever 42 defines a pivot hole 420 in an end thereof, and a mounting hole 422 in an opposite end thereof. The pivot hole 420 is used for pivotally attaching the operating lever 42 to the second shaft 46. Thus, the operating lever 42 can rotate about the second shaft 46. The mounting hole 422 is adapted for mounting the operating lever 42 to the first shaft 44. The leaf spring 48 is substantially C-shaped, and comprises a main body 482 and a pair of ear portions 480 at opposite ends of the main body 482 respectively. The main body 482 is slightly curved. Each ear portion 480 defines a through hole 484, for attaching the leaf spring 48 to the first shaft 44.

Figure 2:
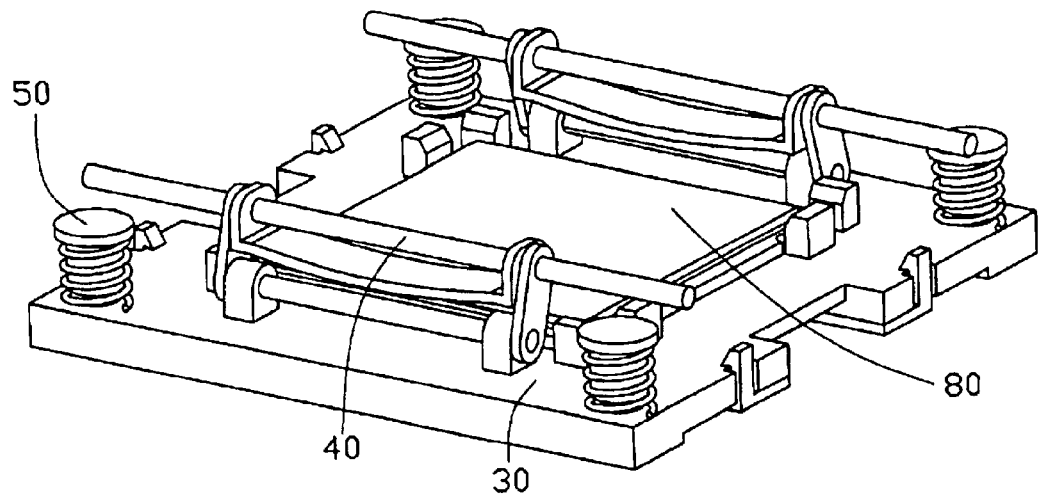
FIG. 2 is an assembled view of FIG. 1, but not showing a lid of the test connector.
Figure 3:
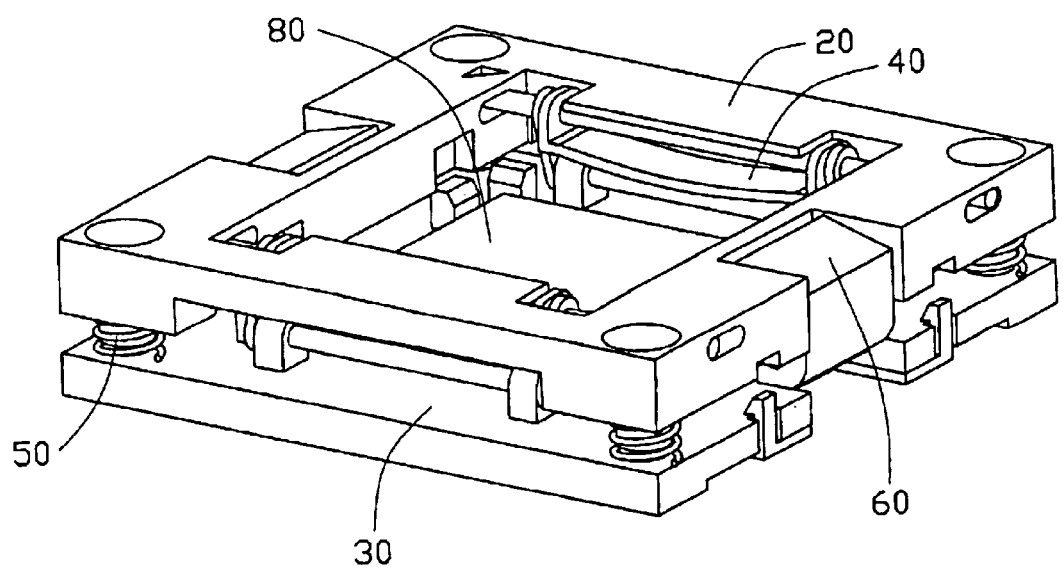
FIG. 3 is a complete assembled view of FIG. 1, showing the test connector in an open position.

Referring to FIGS. 2 and 3, in assembly, the LGA chip 80 is mounted on the inner housing 32 of the connector body 30. The second shafts 46 are retained in the receiving holes 3422 of the projections 3420 of the connector body 30, with the operating levers 42 pivotally attached to the second shafts 46. The leaf springs 48 are mounted to the first shafts 44, and the operating levers 42 are then mounted to the first shafts 44. Thus, the leaf springs 48 are engaged between the corresponding operating levers 42. The operating levers 42 can rotate about the second shafts 46, thereby actuating the leaf springs 48 to tilt upwardly or downwardly. Accordingly, the leaf springs 48 can hold or release the LGA chip 80. The guiding mechanisms 50 are retained in the blind holes 340 of the connector body 30. The latches 60 are pivotally attached to the pivot axles 282 of the lid 20. The lid 20 is mounted on the connector body 30, with the guiding mechanisms 50 being received in the guiding holes 24 of the lid 20. Thus the lid 20 can only move vertically relative to the outer housing 34. The first shafts 44 are received in the receiving grooves 284 of the lid 20, with the extending portions 260 abutting tops of the first shafts 46. The first shafts 44 can slide in the receiving grooves 284 of the lid 20 in directions perpendicular to respective rotational axes of the first shafts 44 themselves.

Referring particularly to FIG. 3, in use, the test connector 10 is oriented in an open position. In the open position, the lid 20 is in the upper position, and the pressing mechanisms 40 are defined to be in respective first positions. In the first positions, the main bodies 482 of the leaf springs 48 are parallel to the first shafts 44 and the second shafts 46, and are disengaged from the LGA chip 80. In the open position, the LGA chip 80 can be placed on the inner housing 34 via the opening 22 of the lid 20, for undergoing a burn-in test. Similarly, the LGA chip 80 can be removed from the test connector 10 via the opening 22 of the lid 20 after the burn-in test has been completed. The latches 60 are unlocked from the connector body 30, and the lid 20 can move vertically relative to the connector body 30.

Figure 4:
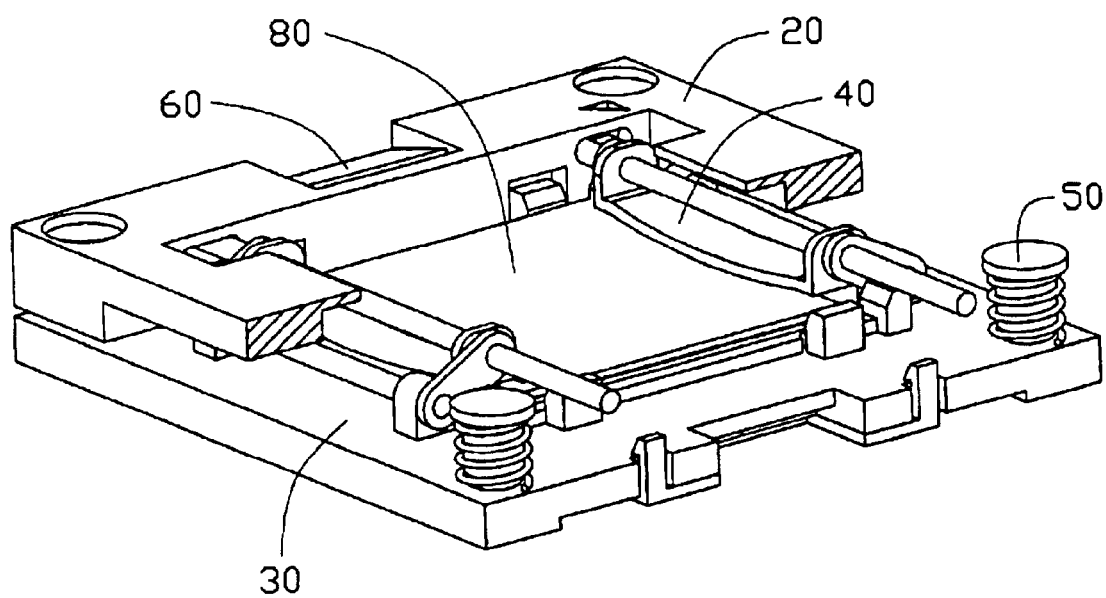
FIG. 4 is similar to FIG. 3, but showing the test connector in a closed position, and with half of the lid cut away.
Figure 5:
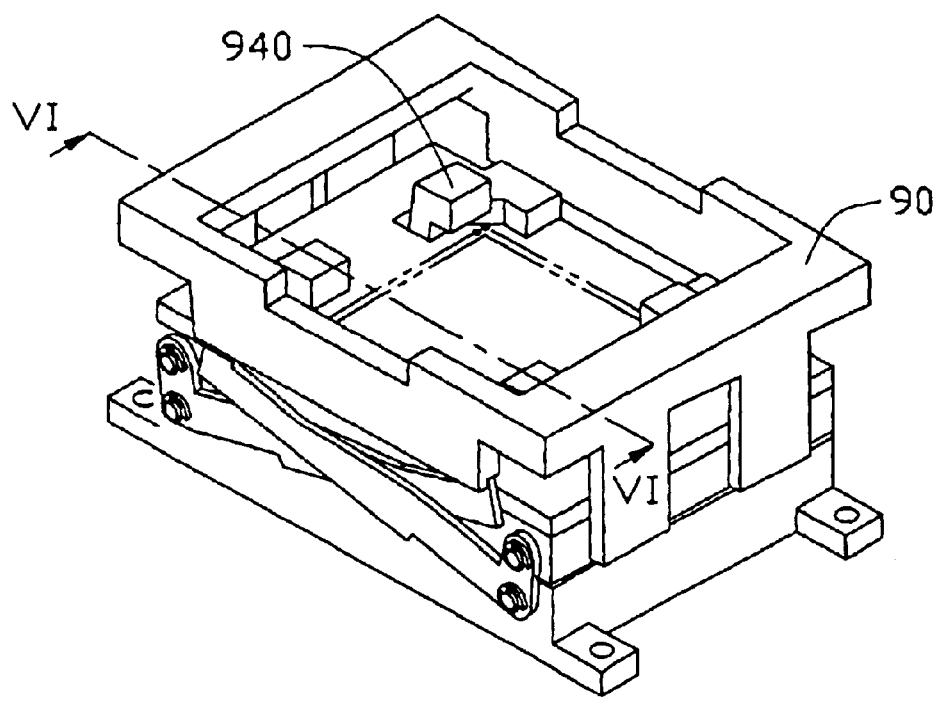
FIG. 5 is an isometric view of a conventional test connector.
Figure 6:
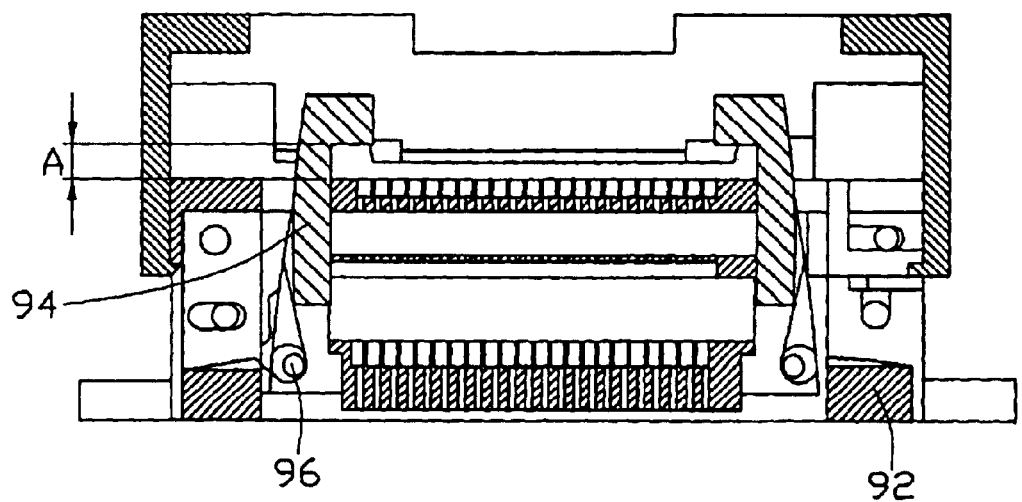
FIG. 6 is a cross-sectional view taken along line VI—VI of FIG. 5.

FIG. 4 shows the test connector 10 is in the closed position. When the lid 20 is pushed from the upper position downwardly by an external force, the lid 20 is moved to a lower position relative to the outer housing 34, and corresponding force is applied to the first shafts 44. The first shafts 44 slide horizontally along the receiving grooves 284, and move downwardly relative to the second shafts 46. The first shafts 44 translate such horizontal and downward movement into pivotal forces acting on the operating levers 42. Therefore, the operating levers 42 are pivoted horizontally and downwardly about the second shafts 46. Simultaneously, the operating levers 42 drive the leaf springs 48 to move horizontally and downwardly to respective second positions. In the second positions, the main bodies 482 of the leaf springs 48 are brought into engagement with the LGA chip 80, thereby mechanically and electrically connecting the LGA chip 80 with the terminals of the connector body 30. The latches 60 are locked to the connector body 30, thereby retaining the lid 20 in the lower position. At this stage, the external force applied on the lid 20 can be released. The test connector 10 is retained in the closed position, and the LGA chip 80 can be tested. When the lid 20 is moved downwardly from the upper position to the lower position, the coil springs 54 of the guiding mechanisms 50 are compressed. When the external force is released and the latches 60 are unlocked from the connector body 30, the coil springs 54 decompress and drive the lid 20 back upwardly to the upper position. The operating levers 42 accordingly drive the leaf springs 48 to move back from the second positions to the first positions.

Unlike conventional socket connectors, the test connector 10 can test various LGA chips 80 having different thicknesses. Because the operating levers 42 can pivot about the second shafts 46, a height between the second shafts 46 and the main bodies 482 of the corresponding leaf springs 48 is variable. In other words, a height between the inner housing 32 and the main bodies 482 of the leaf springs 48 is variable. With this configuration, whatever thickness a particular LGA chip 80 has, it will be appropriately pressed by the leaf springs 48 and securely engaged with the terminals of the test connector 10. In addition, because the leaf springs 48 have good resilience and flexibility, they can cushion the external force and thereby protect the LGA chip 80.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A test connector for burn-in testing of an integrated circuit (IC) package, the test connector comprising:

a connector body with a plurality of terminals therein, the connector body comprising an inner housing and an outer housing, the inner housing being mounted on the outer housing and receiving the IC package;

a lid positioned over the connector body and restrictively movable up-and-down relative to the outer housing;

a plurality of guiding mechanisms disposed between the lid and the connector body; and a plurality of pressing mechanisms engaged between the lid and the connector body for holding or releasing the IC package, each of the pressing mechanisms comprising a leaf spring;

wherein when the lid is in an upper position, the pressing mechanisms are in a first position in which the leaf springs are disengaged from the IC package, while when the lid is in a lower position, the pressing mechanisms are moved to a second position in which the leaf springs are engaged with the IC package, thereby mechanically and electrically connecting the IC package to the terminals, wherein each of the pressing mechanisms comprises a first shaft attached to the lid, a second shaft mounted to the outer housing, and a pair of operating levers engaged between the first shaft and the second shaft, wherein the leaf spring comprises a pair of ear portions and a main body, each ear portions defining a through hole, wherein the leaf spring is mounted to the first shaft through the holes of the ear portions and positioned between the operating levers, and wherein each of the operating levers comprises a pivot hole in an end thereof for pivotally attached the operating lever to the second shaft, and a mounting hole in an opposite end thereof for mounting the operating lever to the first shaft.

2. The test connector as described in claim 1, wherein each of the guiding mechanisms comprises a guiding post for preventing lateral movement of the lid relative to the outer housing, and a coil spring to provide a biasing force between the lid and the outer housing, the coil spring disposed around the guiding post.

3. The test connector as described in claim 2, wherein a plurality of blind holes is defined in corners of the outer housing respectively, and a plurality of guiding holes corresponding to the blind holes is defined in the lid, the blind holes and the guiding holes receiving the guiding mechanisms.

4. The test connector as described in claim 3, wherein the outer housing comprises a pair of opposite first end portions and a pair of opposite first side portions.

5. The test connector as described in claim 4, wherein each of the first end portions comprises a pair of spaced, aligned projections each defining a receiving hole for receiving the second shaft of the pressing mechanism.

6. The test connector as described in claim 5, wherein each of the first side portions defines a first cutout in a center thereof.

7. The test connector as described in claim 6, wherein the lid comprises a pair of opposite second end portions corresponding to the first end portions of the outer housing, and a pair of opposite second side portions corresponding to the first side portions of the outer housing.

8. The test connector as described in claim 7, wherein each of the second end portions comprises an extending portion extending inwardly from an inner side thereof, the extending portion abutting against the pressing mechanism.

9. The test connector as described in claim 7, wherein each of the second side portions defines a second cutout in a center thereof, and a pair of aligned receiving grooves in each of opposite ends thereof for receiving the first shafts of the pressing mechanism.

10. The test connector as described in claim 9, wherein each of opposite end walls of the second cutout defines a mounting hole, and a pivot axle is mounted in the mounting holes.

11. The test connector as described in claim 10, wherein a pair of latches is pivotally mounted to the pivot axles of the lid at the second cutout.

12. The test connector as described in claim 11, wherein when the lid is in the lower position, the latches are locked to the connector body, while when the lid is in the upper position, the latches are unlocked from the connector body.

* * * * *